(12) United States Patent
Zebedee (10) Patent No.: US 8,264,264 B2
(45) Date of Patent: Sep. 11, 2012

(54) MULTIPLE PHASE PULSE GENERATOR

(75) Inventor: Patrick Zebedee, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 96 days.

(21) Appl. No.: 12/448,603

(22) PCT Filed: Jan. 25, 2008

(86) PCT No.: PCT/JP2008/051605
§ 371 (c)(1),
(2), (4) Date: Jun. 26, 2009

(87) PCT Pub. No.: WO2008/093816
PCT Pub. Date: Aug. 7, 2008

(65) Prior Publication Data
US 2010/0090742 A1    Apr. 15, 2010

(30) Foreign Application Priority Data
Jan. 30, 2007  (GB) .................... 0701709.8

(51) Int. Cl.
*H03K 23/00* (2006.01)
*H03K 25/00* (2006.01)
(52) U.S. Cl. ..................... 327/241; 345/100
(58) Field of Classification Search .......... 327/241; 345/100
See application file for complete search history.

(56) References Cited

U.S. PATENT DOCUMENTS

| | | | |
|---|---|---|---|
| 5,282,234 A | 1/1994 | Murayama et al. | |
| 6,377,099 B1 | 4/2002 | Cairns et al. | |
| 6,876,352 B1 | 4/2005 | Sato et al. | |
| 7,027,551 B2 | 4/2006 | Han et al. | |
| 2004/0150610 A1 | 8/2004 | Zebedee et al. | |
| 2005/0184784 A1 | 8/2005 | Washio et al. | |
| 2007/0171179 A1* | 7/2007 | Morosawa | 345/100 |

FOREIGN PATENT DOCUMENTS

| | | |
|---|---|---|
| GB | 2 396 948 | 7/2004 |
| JP | 2000-236234 | 8/2000 |
| JP | 2005-244956 | 9/2005 |

* cited by examiner

*Primary Examiner* — Lincoln Donovan
*Assistant Examiner* — Daniel Rojas
(74) *Attorney, Agent, or Firm* — Harness, Dickey & Pierce, PLC (57) ABSTRACT

In one embodiment of the present invention, a multiple phase pulse generator includes n stages, where each stage includes a first sub-stage and a second sub-stage. The first sub-stage includes a first memory element and the second sub-stage includes a second memory element. The first memory element of each stage is arranged to be set by the preceding stage. The first sub-stage is arranged to supply a stage output pulse while the first memory element is set. The second memory element is arranged to be set by the stage output pulse. The second sub-stage is arranged to hold the first memory element reset after the stage output pulse while the second memory element is set.

24 Claims, 13 Drawing Sheets

PRIOR ART

FIG. 1

PRIOR ART

FIG. 2

PRIOR ART

PRIOR ART

FIG. 6

PRIOR ART

000# MULTIPLE PHASE PULSE GENERATOR

TECHNICAL FIELD

The present invention relates to a multiple phase pulse generator. Such a generator may be used, for example, in a device such as a display.

BACKGROUND ART

Figure 1:
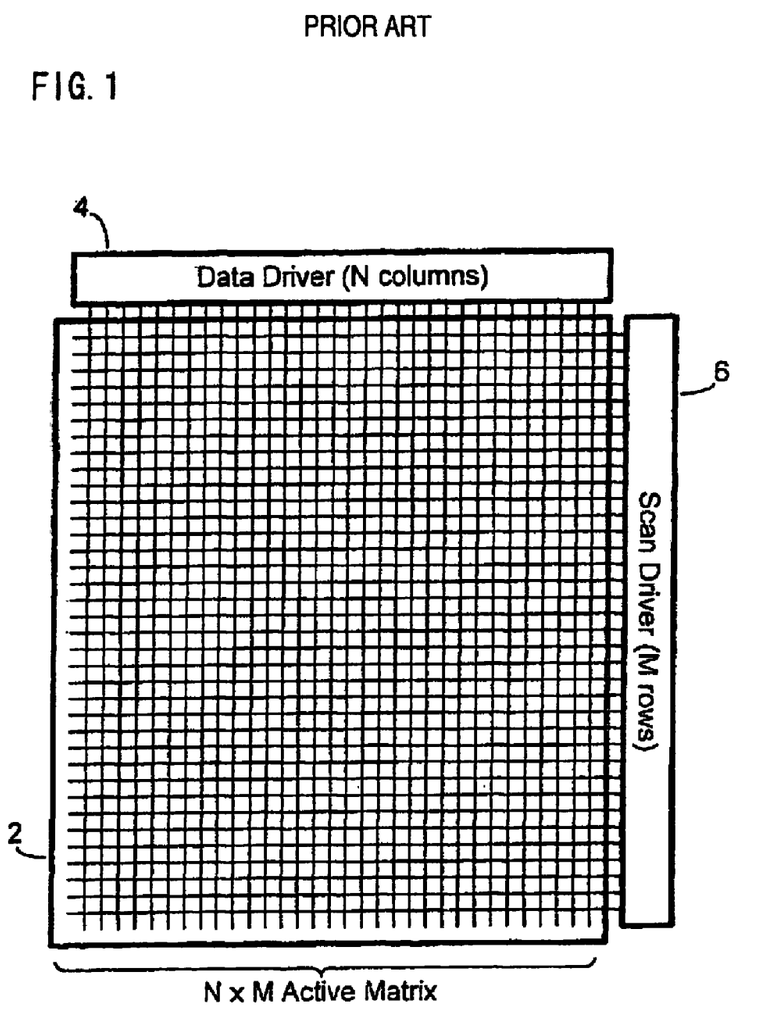
FIG. 1 is a block schematic diagram illustrating a known type of active matrix display.

FIG. 1 shows a typical active matrix display. Such a display is made up of a matrix 2 of picture elements (pixels), arranged in M and N columns. Each row and column is connected to an electrode, with the column electrodes being connected to the N outputs of a data driver 4 and the row electrodes being connected to the M outputs of a scan driver 6.

Figure 2:
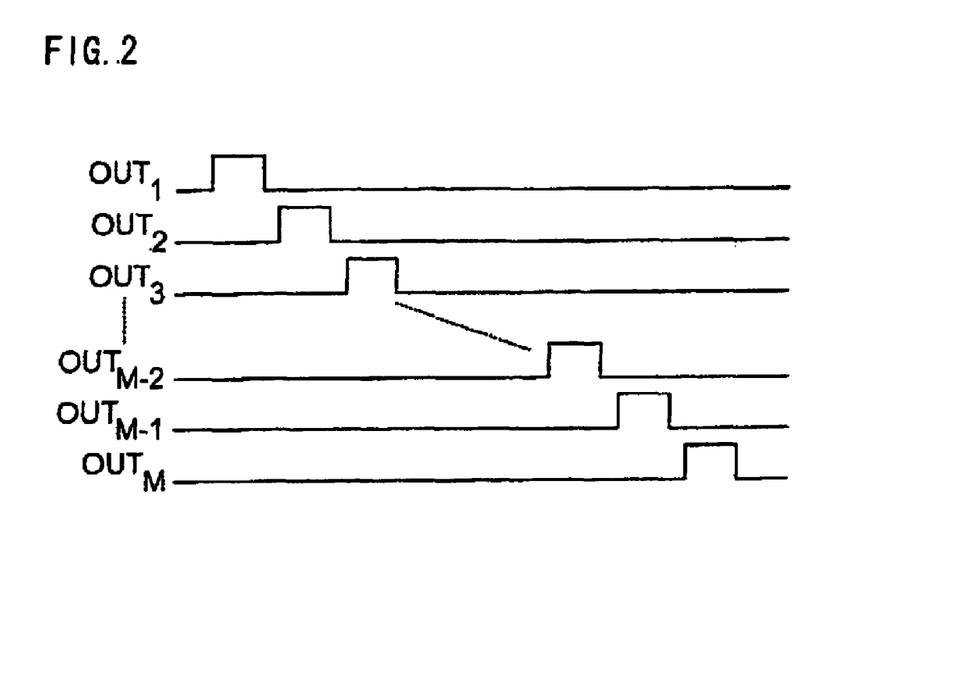
FIG. 2 is a waveform diagram illustrating output pulses of a typical scan driver of the display of FIG. 1.

The pixels are addressed one row at a time. The scan driver includes an M-phase clock generator, which produces a series of clock pulses as shown in FIG. 2. Each clock phase $OUT_i$ controls the activation of row i. It is usual for the pulses to be non-overlapping, such that no two pulses are high at the same time.

All the pixels of one row may be addressed simultaneously, or they may be addressed in B blocks of b pixels, where bB=N. In the latter case, the data driver may also include a B-phase clock generator of the type described, such that each clock pulse $OUT_i$ activates block i.

Normal operation of the display is such that data is sampled onto the pixels from top to bottom and from left to right, corresponding to the timing shown in FIG. 2. However, it is a common requirement for the direction of sampling to be switchable, such that data is sampled onto the pixels from the bottom to top and/or from right to left. In this way, it is possible to reflect or rotate the displayed image without re-ordering the input data. Such re-ordering requires considerable additional circuitry, such as additional memory sufficient to store the whole image.

Figure 3:
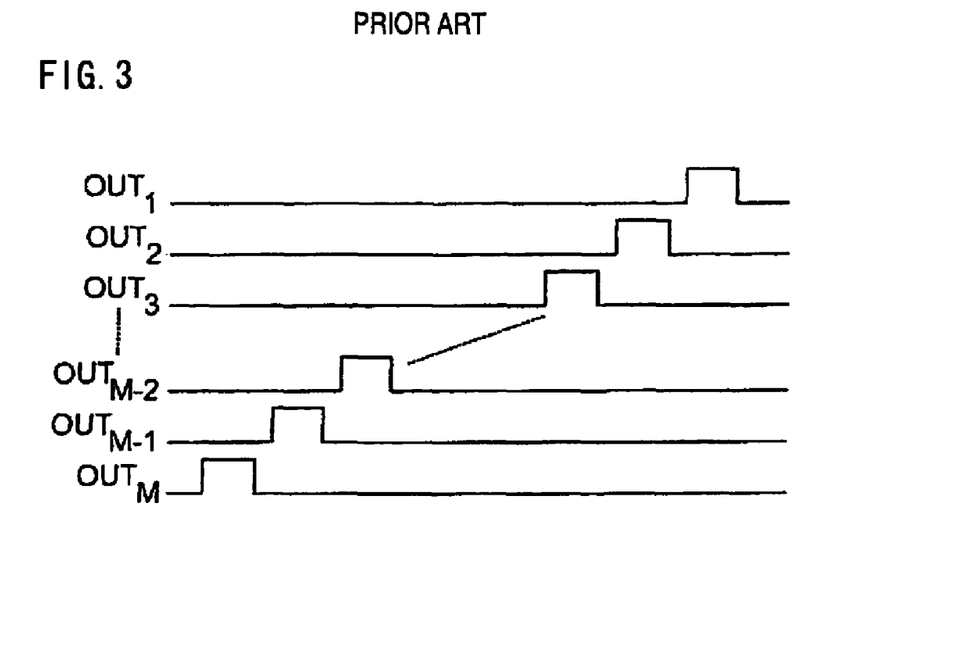
FIG. 3 is a waveform diagram illustrating scan driver output pulses for a reverse mode of operation.

In this case, the clock generators must in addition be able to operate bi-directionally, producing either clock pulses as in FIG. 2, or clock pulses of the type shown in FIG. 3. Each pulse OUT in FIG. 3 still activates row i. However, pulse $OUT_i$ occurs before pulse $OUT_{i-1}$, whereas in FIG. 2 pulse $OUT_i$ occurred after pulse $OUT_{i-1}$.

Clock generators of the type described may be formed directly on the display substrate, reducing the number of connections required to the display. This is advantageous, since it reduces the area occupied by the connector, and leads to a display which is more mechanically robust.

Such a clock generator may be formed from a shift register. A shift register is a multi-stage circuit capable of sequentially shifting a sequence of data from stage to stage along its length in response to a clock signal. In general, a shift register may shift an arbitrary sequence of data. However, when a shift register is used as a clock generator in a scan or data driver, it is only required to shift a single high state along its length. Such a shift register is referred to as a "walking one" shift register, and may or may not be capable of shifting an arbitrary sequence of data.

Figure 4:
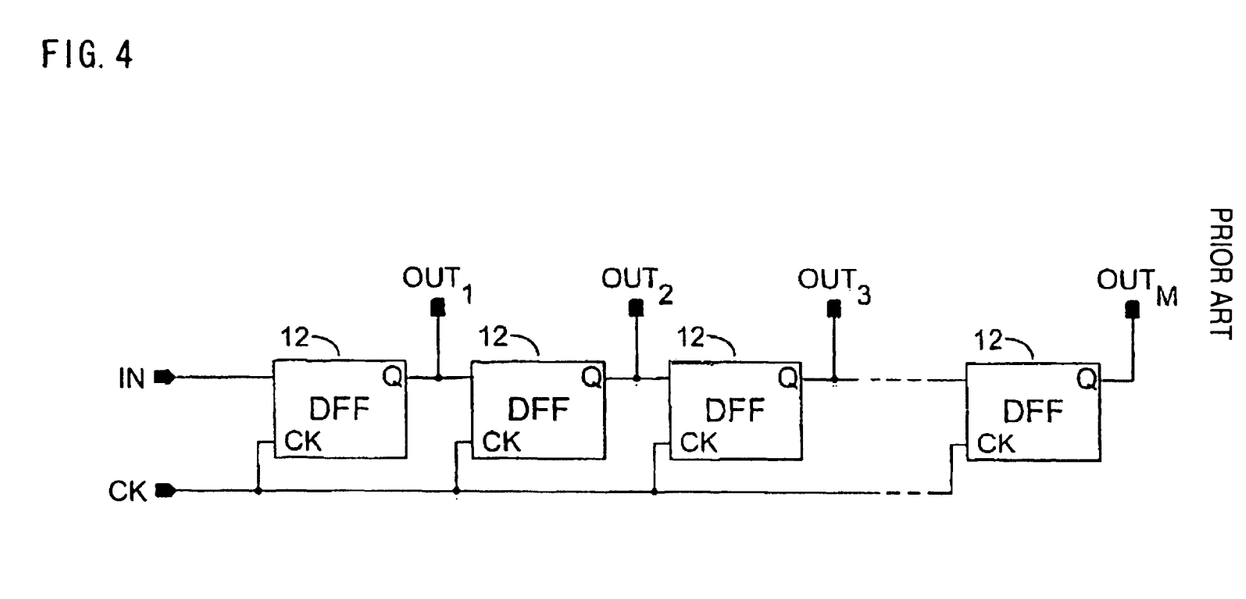
FIGS. 4 to 7 are block schematic diagrams illustrating known types of shift registers for use in scan drivers.

A known type of clock generator for use in such an application is a shift register comprised of a cascade of D-type flip-flops (DFF) 12 controlled by a clock signal CK, as shown in FIG. 4. On each rising edge of CK, the data at the Q output of $DFF_i$ is sampled onto the D input of $DFF_{i+1}$, and is passed to its Q output. In this way, data can be passed along the register one stage at a time. It can be seen that, if a single '1' is sampled onto the D input of the first $DFF_{1}$, the outputs of the register, $Q_i$, will be of the general form shown in FIG. 2.

However, this type of shift register has two disadvantages when it is required to generate pulses for use in a scan driver: first, that the pulses have coincident edges (that is $Q_{i+1}$ rises as $Q_i$ falls); and second, that there is no simple method to reverse its direction of scan. In order to control the time between $Q_i$ falling and $Q_{i+1}$ rising, it is necessary to include an additional circuit element or elements between the respective stages. To control the direction of scan it is necessary to include switches such that $Q_i$ may be connected to either $D_{i-1}$ or $D_{i+1}$. Such additional elements and switches add to the area required for the circuit, and require additional control signals (in general a switch is made up of an n-channel and a p-channel transistor, and requires both a control signal UD and its complement UDB to control its conduction). In particular, it is desirable to remove the switches since they and their associated wiring occupy a larger physical area than a similar number of logic transistors.

Figure 5:
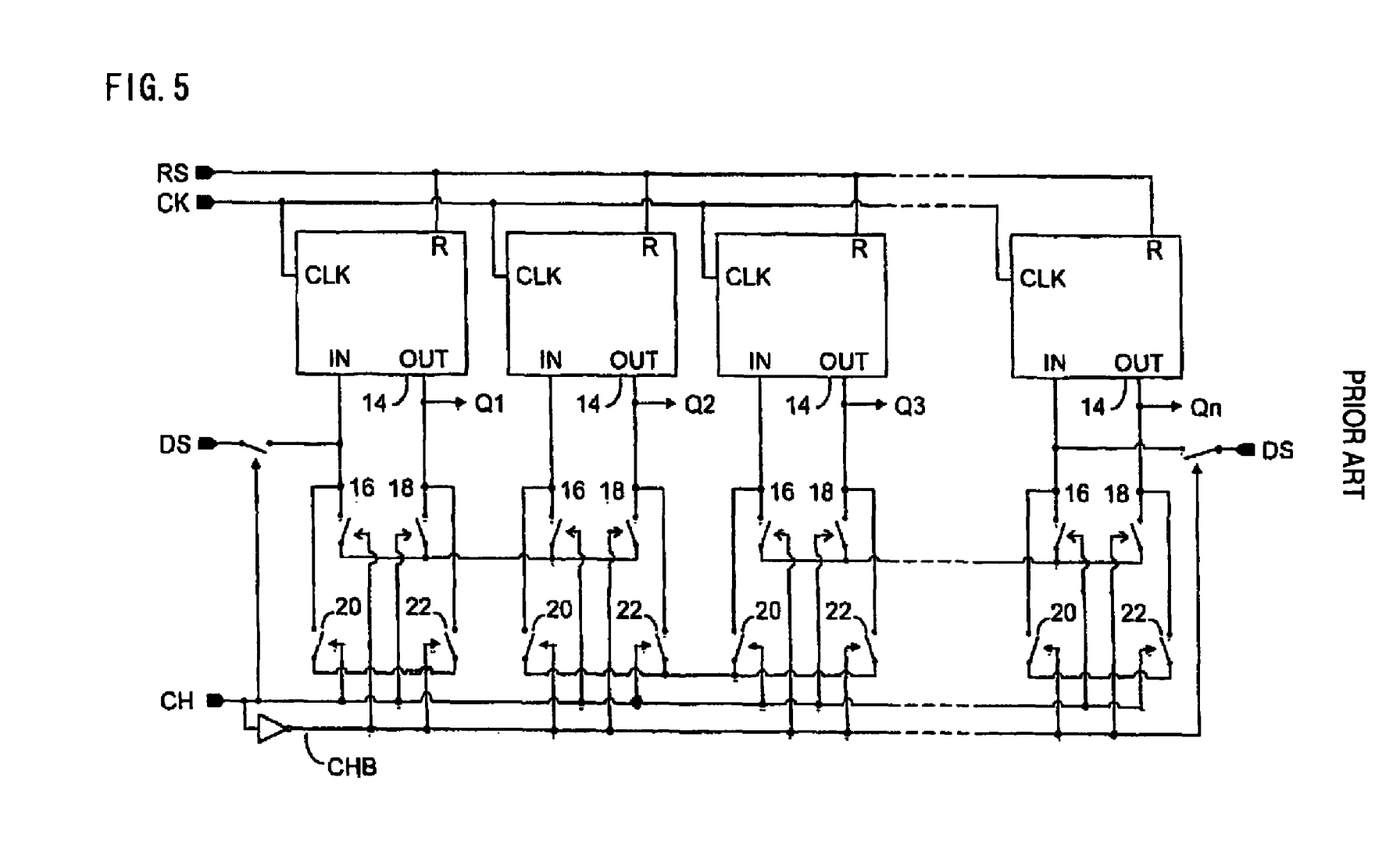

An example of such a clock generator is disclosed in U.S. Pat. No. 5,282,234, and is shown in FIG. 5. In this case, the shift register is composed of a series of flip-flops 14 with additional elements to prevent coincident edges (an analogue switch, an inverter with hysteresis and a capacitor), and a set of switches 16-22 to control the direction of propagation.

Figure 6:
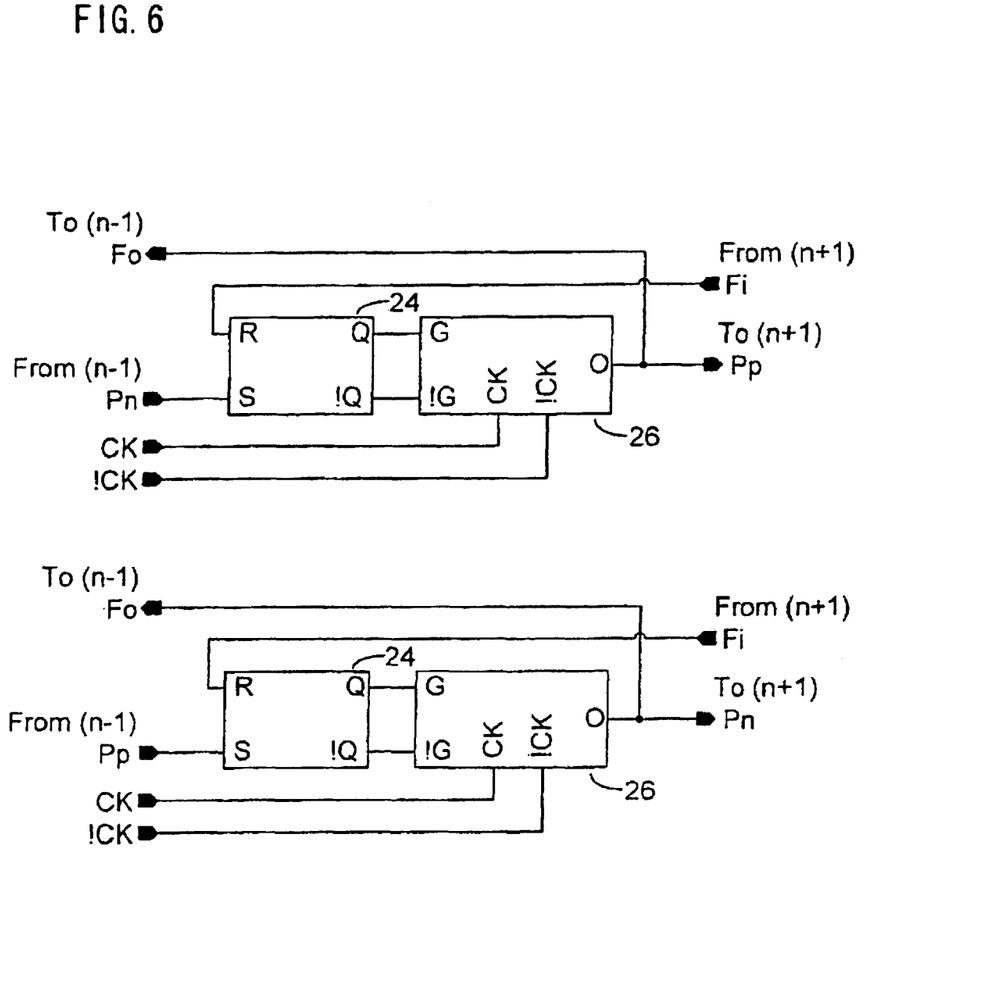

Another example of such a type of clock generator is disclosed in U.S. Pat. No. 6,377,099, and is shown in FIG. 6. In this case, the flip-flop 24 is of the reset-set type (RSFF), with an additional gate 26 to control the passage of the clock. The output of gate 26 sets the next RSFF $24_{i+1}$ and resets the previous RSFF $24_{i-1}$. In order for this shift register to operate bi-directionally, switches are required to connect the output of the gate $26_i$ to the set input of RSFF $24_{i-1}$ or $24_{i+1}$, and to the reset input of RSFF $24_{i+1}$ or $24_{i-1}$.

Figure 7:
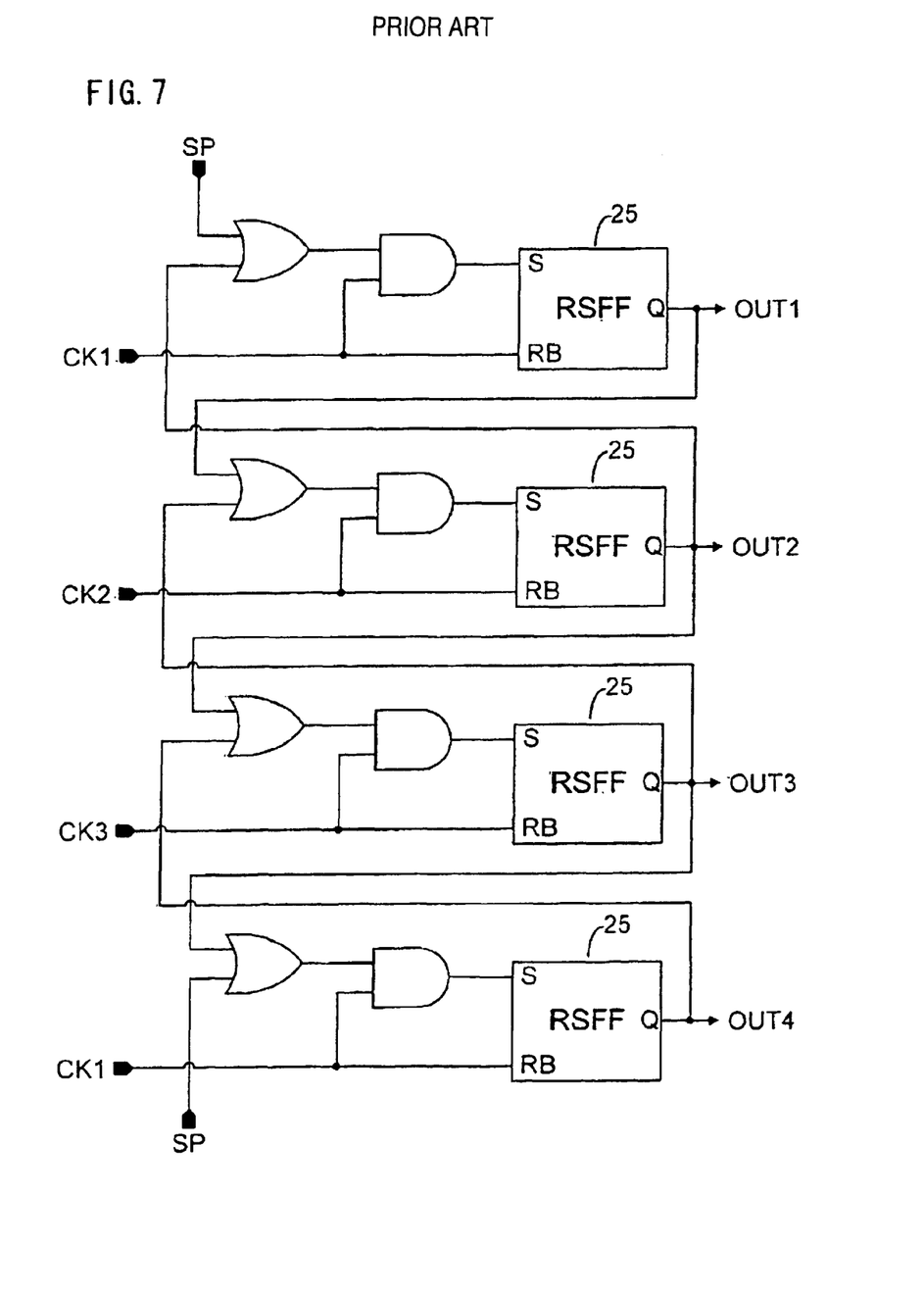

An alternative type of shift register is disclosed in the US patent application 2004/015061A1, and is shown in FIG. 7. This type of register is composed of a cascade of RSFFs 25, but does not require switches to operate bi-directionally. However, the register requires at least three clock signals, and, since its outputs are overlapping, it requires additional logic and/or signals to generate non-overlapping output pulses. The additional clocks increase the complexity of the circuits controlling the register, and, in the case where the register is formed on the display substrate, increase the number of connections to the display.

All of the above registers are started by a start pulse generator applied to one end of the register. Their direction of scan is controlled by the combination of the choice of start point and either the order of the clocks, or by an additional signal or signals.

DISCLOSURE OF INVENTION

According to a first aspect of the invention, there is provided a multiple phase pulse generator comprising n stages, where n is greater than one and each ith stage, for all i such that $1 \leq i \leq n$, comprises a first substage having a first memory element and a second substage having a second memory element, the first memory element of each jth stage, for all j such that $1 < j \leq n$, being arranged to be set by the (j−1)th stage, the first substage of each ith stage being arranged to supply a stage output pulse while the first memory element is set, the second memory element of each ith stage being arranged to be set by the stage output pulse, and the second substage of each ith stage being arranged to hold the first memory element reset after the stage output pulse while the second memory element is set.

n may be greater than two.

The first memory element may comprise a reset-over-set flip-flop.

The second memory element may comprise a reset-set flip-flop.

The first substage may comprise a first gate arrangement connected to the first memory element and to a clock input and arranged to pass a clock pulse from the clock input as the stage output pulse while the first memory element is set.

The second substage may comprise a second gate arrangement connected between the second memory element and a reset input of the first memory element and arranged to inhibit resetting of the first memory element during the stage output pulse.

A set input of the first memory element of each jth stage may be connected to an output of the second substage of each (j−1)th stage. As an alternative, a set input of the first memory element of each jth stage may be connected to receive the stage output pulse from the (j−1)th stage. Alternate ones of the stages may be arranged to receive alternate clock pulses from a clock pulse source.

The first and second memory elements of each kth stage, for all k such that $1 \leq k \leq (n-a)$ where $a \geq 1$, may be arranged to be reset by the (k+a)th stage. The first and second memory elements of kth stage may be arranged to be reset by the stage output pulse of the (k+a)th stage and $a \geq 2$. As an alternative, the first and second memory elements of each kth stage may be arranged to be reset by the output of the second substage of the (k+a)th stage.

The first memory element of the first stage may be arranged to be set by a first start pulse.

The first memory element of each lth stage, for all l such that $1 \leq l < n$, may be arranged to be set by the (l+1)th stage. The first element of the nth stage may be arranged to be set by a second start pulse.

A set input of the first memory element of each lth stage may be connected to an output of the second substage of each (l+1)th stage. As an alternative, a set input of the first memory element of each lth stage may be connected to receive the stage output pulse from the (l+1)th stage.

The first and second memory elements of each mth stage, for all m such that $(b+1) < m \leq n$ where $b \geq 1$, may be arranged to be reset by the (m−b)th stage. The first and second memory elements of each mth stage may be arranged to be reset by the stage output pulse of the (m−b)th stage and $b \geq 2$. As an alternative, the first and second memory elements of each mth stage may be arranged to be reset by the output of the second substage of the (m−b)th stage.

The first and second elements of all of the stages may be arranged to be reset by a common reset signal.

According to a second aspect of the invention, there is provided a device including a generator according to the first aspect of the invention.

The device may comprise a display.

The device may comprise an active matrix device.

The device may comprise a liquid crystal device.

It is thus possible to provide a multiple phase pulse generator which may be operated using a single clock. It is also possible to provide a generator which is bi-directional but which does not require any additional signals to control the direction of operation. Further, it is possible to provide a generator which provides non-overlapping output pulses. This allows circuits for controlling the generator to be relatively simple and, in embodiments where the generator is formed on a display substrate, allows a number of connections to the substrate to be reduced. The second substage may be embodied entirely of logic circuitry and it is possible to reduce the number of connections between stages. The generator may therefore be arranged to occupy a reduced area.

BEST MODE FOR CARRYING OUT THE INVENTION

Figure 8:
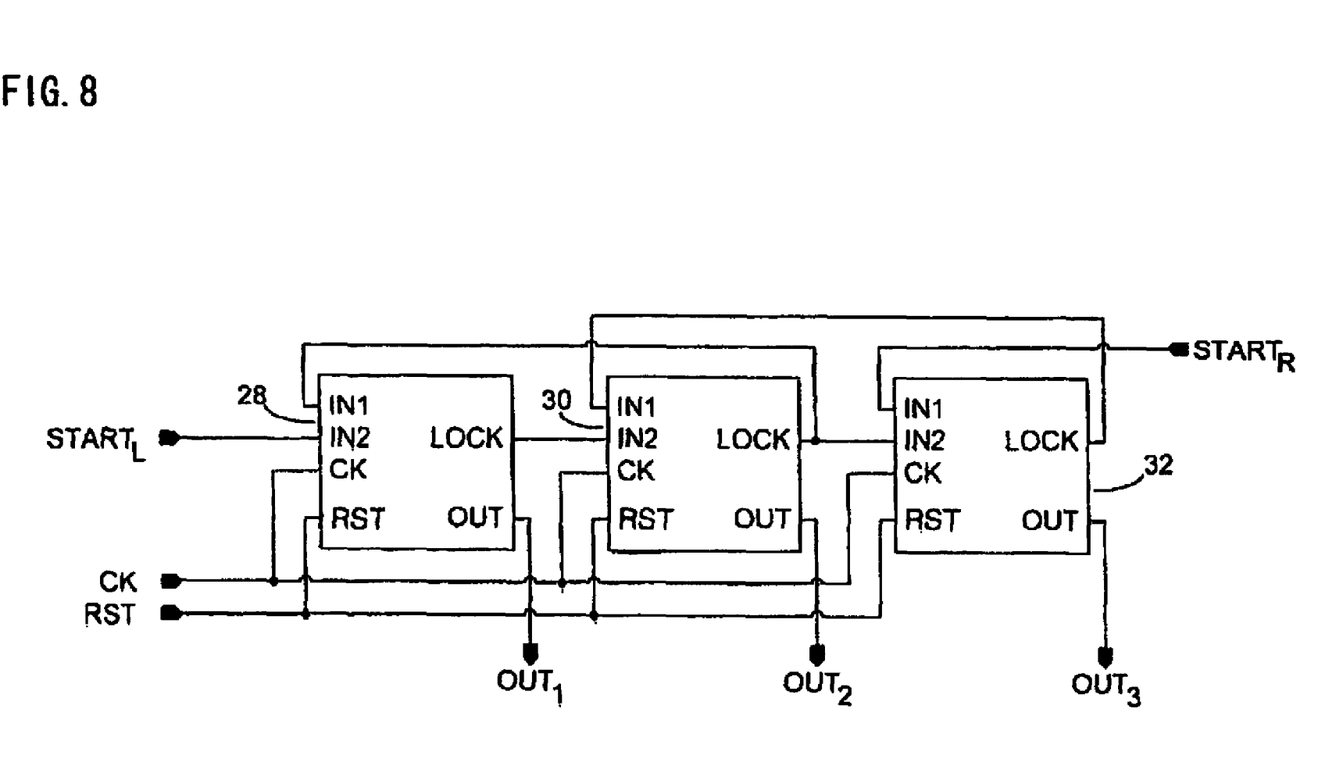
FIG. 8 is a block schematic diagram illustrating a multiple phase pulse generator constituting an embodiment of the invention.
Figure 9:
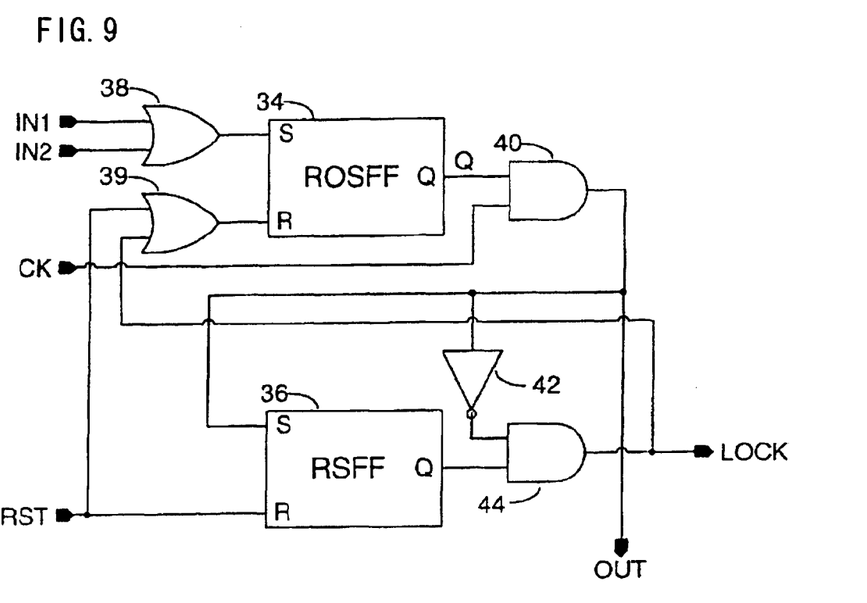
FIG. 9 is a block schematic diagram of one of the stages of the generator of FIG. 8.

The first embodiment is shown in FIGS. 8 and 9. FIG. 8 shows the connections between neighbouring stages of the register 28, 30, 32. Each stage has two inputs, IN1 and IN2, a clock input CK, a reset input RST, a "lock" output LOCK, and a main output OUT. Referring to stage n, IN1 and IN2 are connected to the lock outputs $LOCK_{n+1}$ and $LOCK_{n-1}$ of the neighbouring stages, CK is connected to the register clock CK, RST is connected to a global reset signal RST, LOCK is connected to the inputs $IN1_{n-1}$ and $IN1_{n+1}$ of both neighbouring stages and OUT is connected to the nth output of the register, $OUT_n$.

In the case of the leftmost and rightmost stages 28 and 32, one of the inputs is connected to receive a start pulse. IN1 of stage 28 is connected to receive a left start pulse $START_L$; IN2 of stage 32 is connected to receive a right start pulse $START_R$.

FIG. 9 shows the components of one stage in FIG. 8. A first memory element is embodied as a reset-over-set flip-flop 34 (ROSFF—a RSFF where an active signal on the reset input overrides an active signal on the set input). The second memory element is embodied as a RSFF 36. The inputs IN1 and IN2 are connected to the inputs of an OR gate 38, the output of which is connected to the set input, S, of the ROSFF 34. The Q output of ROSFF 34 is connected to one input of an AND gate 40, the other input of which is connected to the clock input CK. The output of the AND gate is 40 is connected to the output of the stage, OUT, and is also connected to the set input of RSFF 36, and to the input of an inverter 42. The Q output of RSFF 36 and the output of inverter 42 are connected to the inputs of an AND gate 44. The output of AND gate 44 forms the lock output LOCK, and is connected to the first input of OR gate 39. The reset input RST is connected to the reset input of RSFF 36 and to the second input of OR gate 39. The output of OR gate 39 is connected to the reset input, R, of ROSFF 34.

Figure 10:
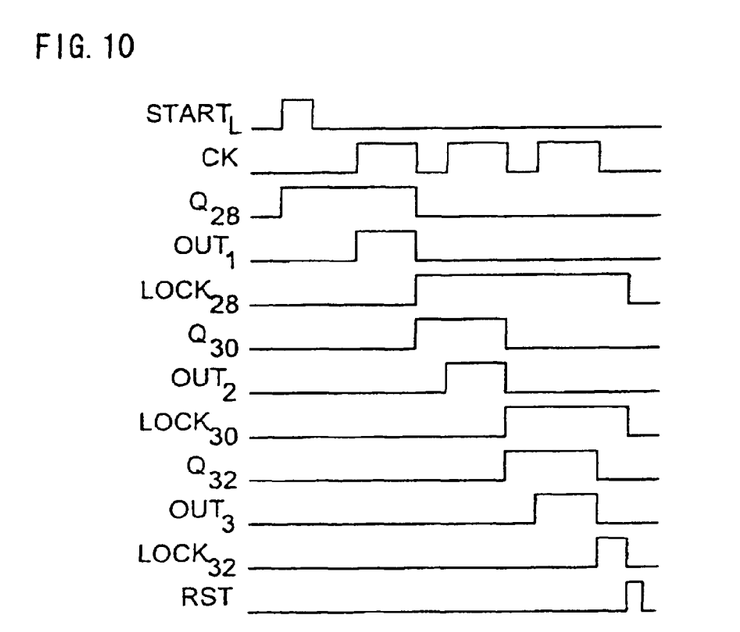
FIG. 10 is a waveform diagram illustrating operation of the generator of FIG. 8.

FIG. 10 illustrates the operation of the register in left-to-right mode. The signals Q refer to the node Q in FIG. 9. The subscripts on the Q and LOCK signals refer to the labels in FIG. 8.

At the start of the operation, all ROSFFs 34 and RSFFs 36 are in their reset state, that is, their Q outputs are low. This may be achieved by raising the reset input RST to a high state, which causes the output of OR gate 39 to rise, and thus applies a high state to the R inputs of ROSFF 34 and RSFF 36.

The operation will be described with reference to an nth intermediate stage such as 30 in FIG. 8. When one of the inputs IN1 and IN2 (connected to the nodes $LOCK_{n-1}$ and $LOCK_{n+1}$) goes high, the output of the OR gate 38 in the nth stage 30 goes high, and the ROSFF 34 of the nth stage 30 is set. This activates the nth stage 30. When ROSFF 34 is set, its Q output is high, and the output of the AND gate 40 is equal to the state of its other input, CK. When the clock CK rises, this is passed through the AND gate 40 to the output OUT, forming the output pulse $OUT_n$. When OUT is high, this drives the output of the inverter 42 low, which in turn drives the output of AND gate 44 low, hence LOCK remains low. In addition, when OUT goes high, RSFF 36 is set, and its Q output is high. When the clock CK falls, the output of AND gate 40 falls, and OUT falls. The output of the inverter 42 rises, and the output of AND gate 44, LOCK, rises. The high state on LOCK persists until RST rises. The high state on LOCK resets ROSFF 34, and prevents it from being set again when IN2 goes high.

The mode of operation will be similar for all stages, and in both left-to-right and right-to-left mode, except that in left-to-right mode, the leftmost stage 28 will be activated by $START_L$, and in right-to-left mode, the rightmost stage 32 will be activated by $START_R$, rather than by the lock output of a preceding stage.

It can be seen that the first memory element 34 is set only while the stage is active (that is, it is enabled to pass a clock pulse to the output), and the second memory element 36 remains set when the stage has previously been active.

Figure 11:
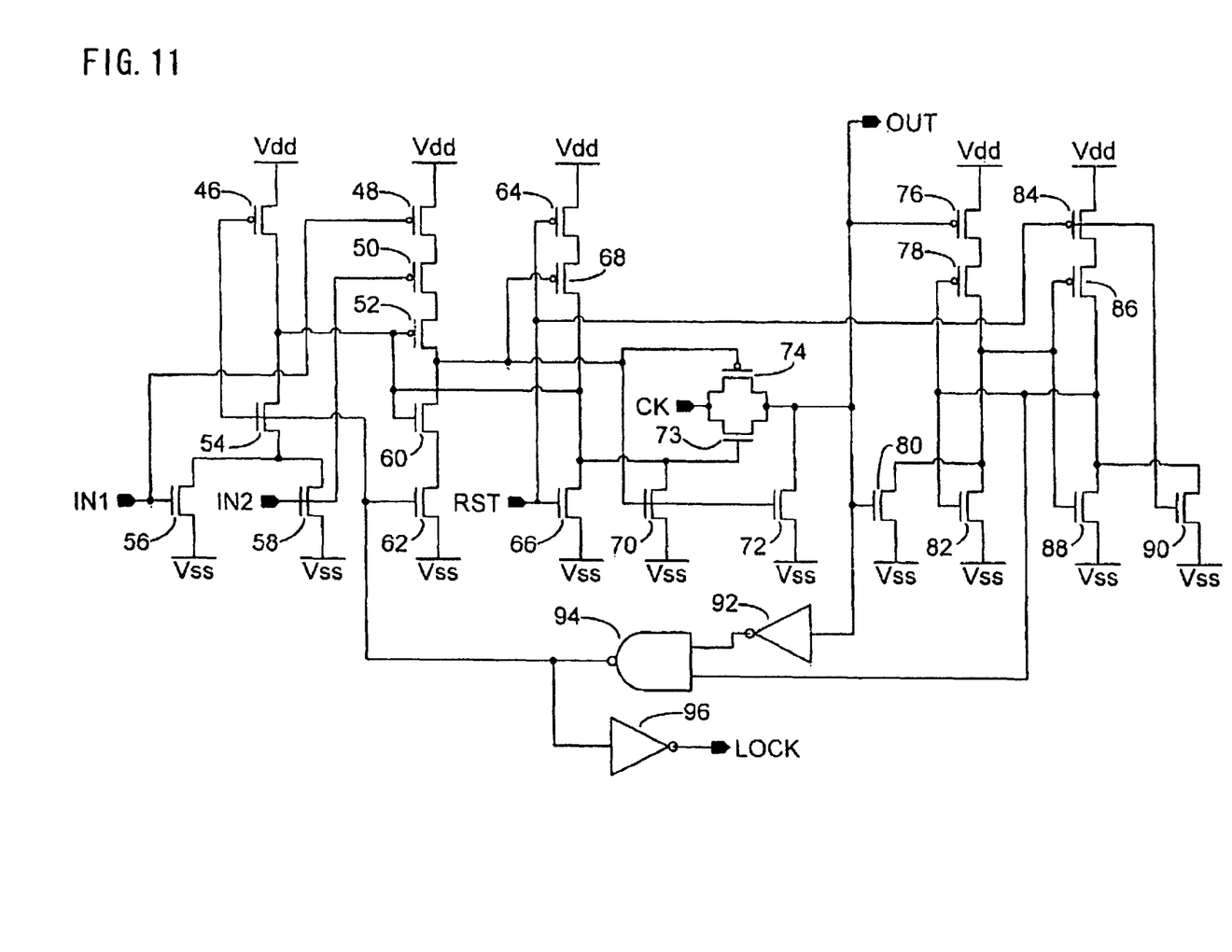
FIG. 11 is a circuit diagram of the stage of FIG. 9.

The blocks 34, 36, 38, 39, 40, 42, 44 may be embodied in any of the standard ways. In addition, FIG. 11 shows the second embodiment, in which the logical function of some of the logic gates 38, 39, 40, 42, 44 is incorporated into the flip-flops 34 and 36. This reduces the number of transistors required.

The circuit of FIG. 11 shows p-channel transistors 46, 48, 50, 52, 64, 68, 74, 76, 78, 84 and 86, n-channel transistors 54, 56, 58, 60, 62, 66, 70, 72, 73, 80, 82, 88 and 90, and inverters 92 and 96, and a NAND gate 94. The sources of p-channel transistors 46, 48, 64, 76 and 84 are connected to a high reference voltage supply, Vdd; the sources of n-channel transistors 56, 58, 62, 66, 70, 72, 80, 82, 88 and 90 are connected to a low reference voltage power supply Vss. The inverters and NAND gate 92, 94, 96 have internal connections to the same power supplies.

The gates of transistors 48 and 56 are connected to the first input IN1; the gates of transistors 50 and 58 are connected to the second input IN2; the source of transistors 73 and 74 are connected to the clock input CK; the gates of transistors 64, 66, 84 and 90 are connected to the reset input RST; the drains of transistors 72, 73 and 74, and the gates of transistors 76 and 80 are connected to the output OUT, and to the input of inverter 92; the output of inverter 96 is connected to the output LOCK.

The drains of transistors 46, 54, 66, 68 and 70 are connected together, and to the gates of transistors 52, 60 and 73; the drains of transistors 56 and 58 are connected together, and to the source of transistor 54; the gates of transistors 46, 54 and 62 are connected together, to the input of inverter 96, and to the output of NAND gate 94; the drains of transistors 52 and 60 are connected together, and to the gates of transistors 68, 70, 72 and 74; the drain of transistor 48 is connected to the source of transistor 50; the drain of transistor 50 is connected to the source of transistor 52; the drain of transistor 62 is connected to the source of transistor 60; the drain of transistor 64 is connected to the source of transistor 68; the drain of transistor 76 is connected to the source of transistor 78; the drain of transistor 84 is connected to the source of transistor 86; the drains of transistors 78, 80 and 82 are connected together and to the gates of transistors 86 and 88; the drains of transistors 86, 88 and 90 are connected together, to the second input of NAND gate 94, and to the gates of transistors 78 and 82; the output of inverter 92 is connected to the first input of NAND gate 94.

The transistors 46-70 therefore operate as a first memory element, which may be set by a high state on either IN1 or IN2, and reset by either a high state on RST or a low state on the output of NAND gate 94. Transistors 52, 60, 68 and 70 are a pair of cross-coupled inverters and form a bi-stable, storing the set or reset state. Transistors 46-70 therefore incorporate the function of ROSFF 34 and OR gates 38 and 39. The transistors 73, 74 and 72 perform the function of AND gate 40. Transistors 76-90 perform the function of RSFF 36, with transistors 78, 82, 86 and 88 forming a bi-stable pair of cross-coupled inverters.

Figure 12:
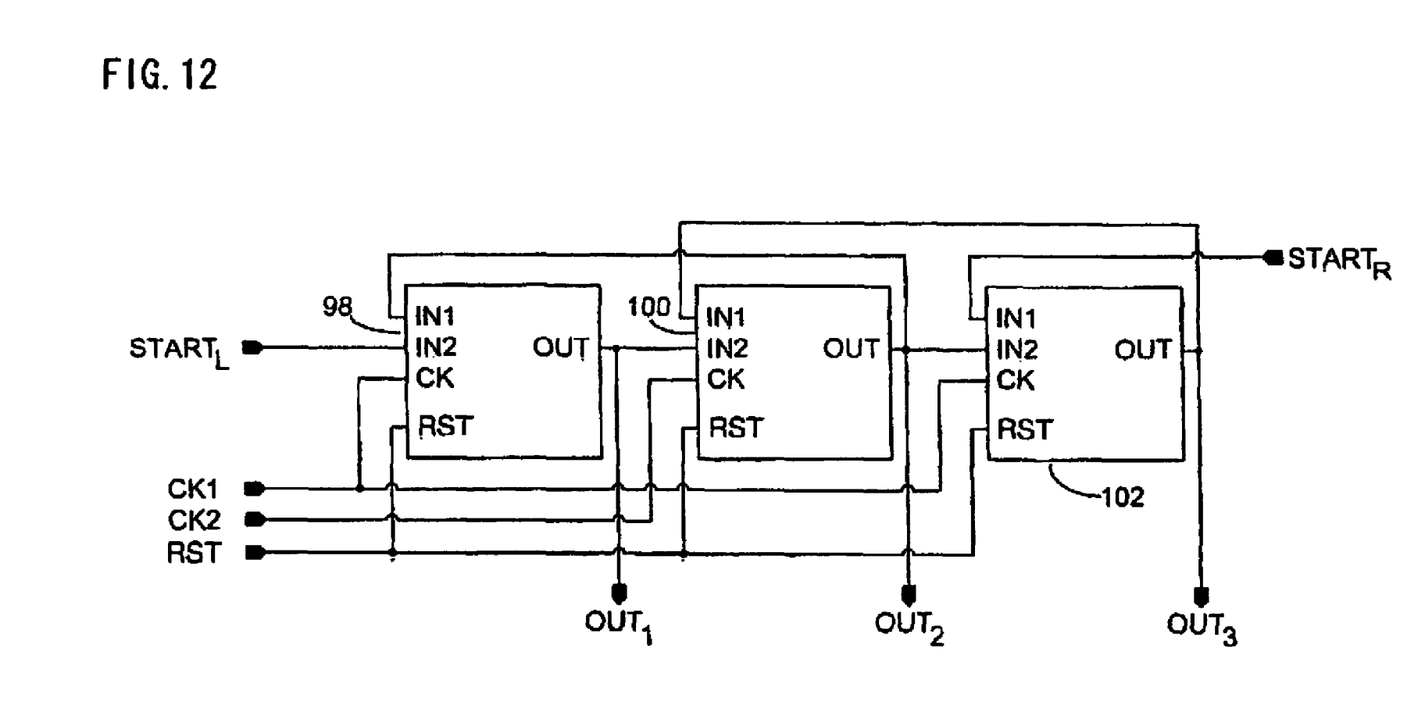
FIG. 12 is a block schematic diagram of a multiple phase pulse generator constituting another embodiment of the invention.

FIG. 12 shows a three-stage register according to a third embodiment of the invention. It comprises stages 98, 100, 102, which are analogous to stages 28, 30, 32 in FIG. 8. The connections are similar, so only the differences between FIGS. 8 and 12 will be highlighted: blocks 98, 100, 102 do not have a LOCK output, but instead have a connection from their OUT outputs to the IN1 and IN2 inputs of neighbouring stages; there are two clocks, CK1 and CK2, with CK1 connected to the CK input of odd stages, and CK2 connected to the CK input of even stages. In other respects, the registers are alike.

Figure 13:
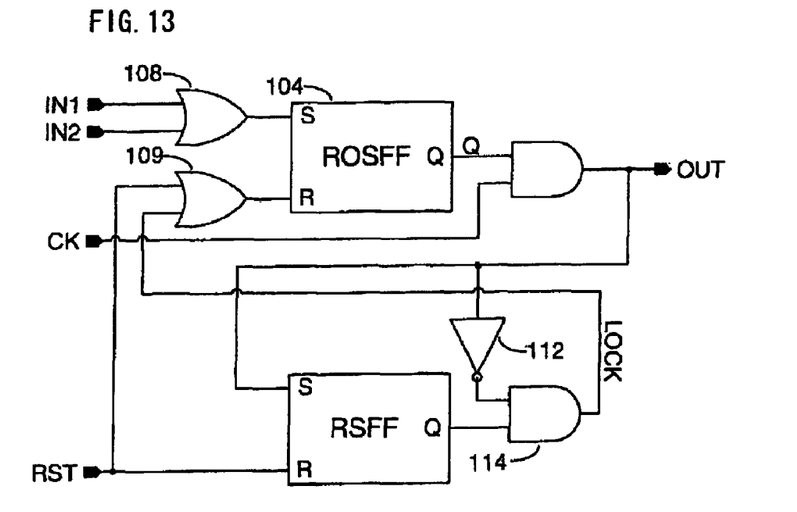
FIG. 13 is a block schematic diagram of one of the stages of the generator of FIG. 12.

FIG. 13 shows the components of one stage of FIG. 12. The design is the same as that in FIG. 9, except that there is no LOCK output, and its description will not be repeated.

Figure 14:
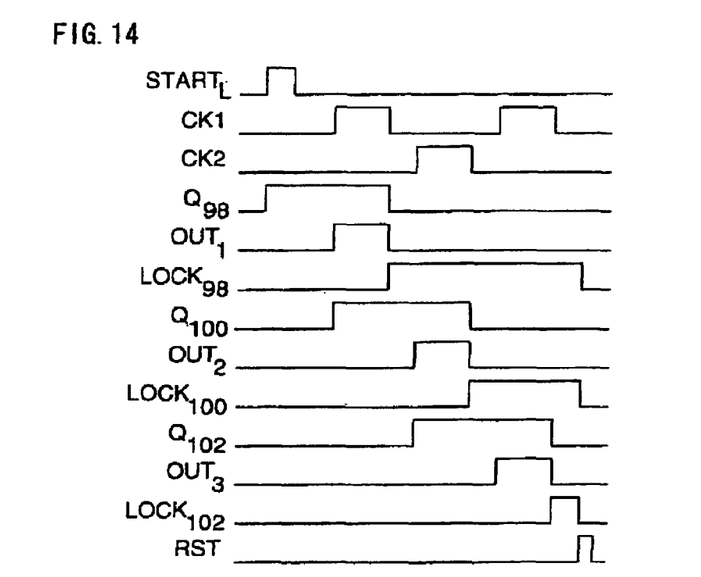
FIG. 14 is a waveform diagram illustrating operation of the generator of FIG. 12.

FIG. 14 illustrates the operation of the register in left-to-right mode. The operation is similar to that shown in FIG. 10, so only the differences will be highlighted: the two clocks carry alternate pulses, such that the logical combination of CK1 OR CK2 is equal to CK in FIG. 10; the Q node of each stage goes high when the preceding stage OUT output, rather than its LOCK output, goes high: this occurs at the rising edge of the clock connected to the preceding stage, rather than the falling edge.

Figure 15:
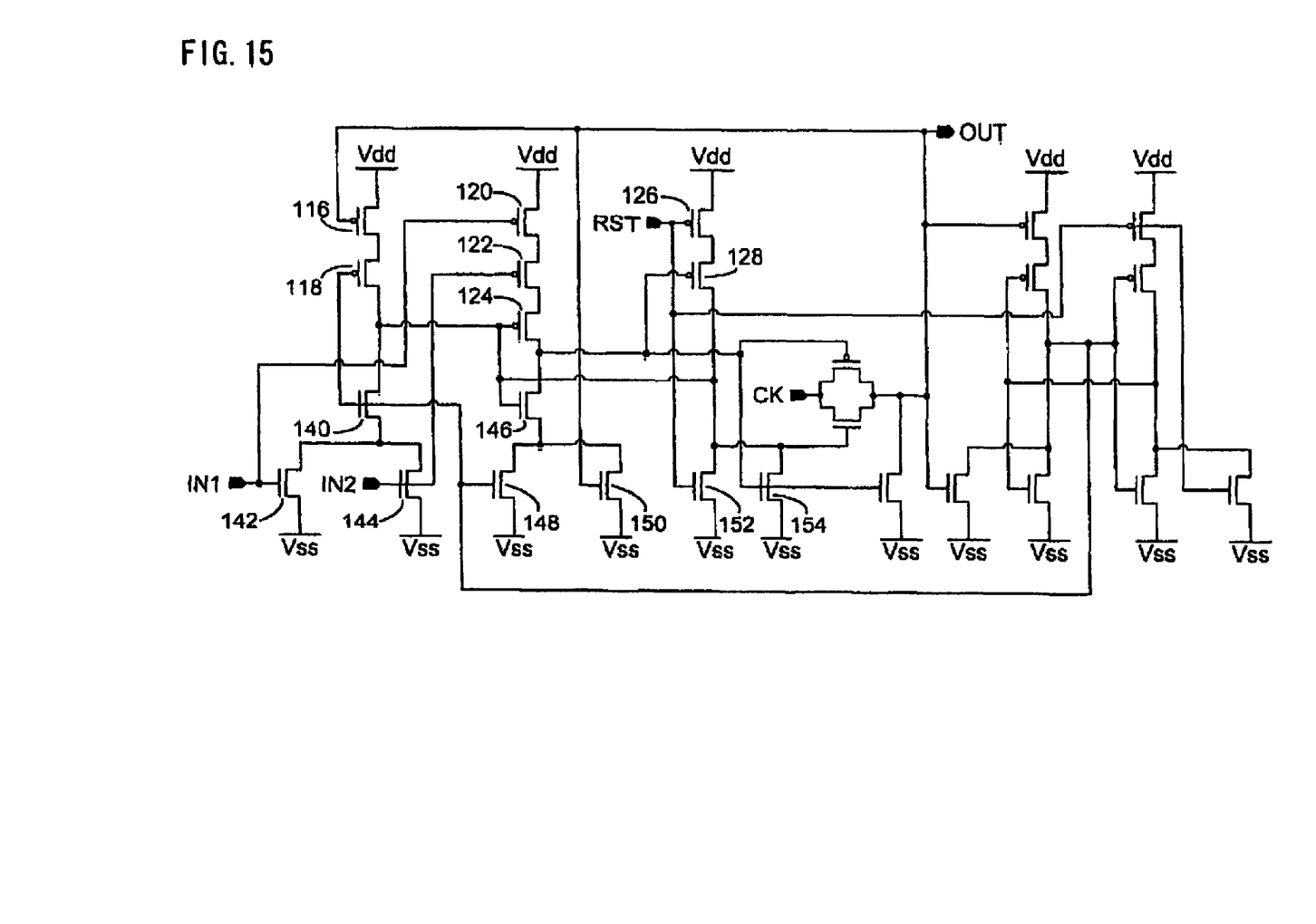
FIG. 15 is a circuit diagram of the stage of FIG. 13.

FIG. 15 shows the fourth embodiment, in which the logical function of inverter 112 and AND gate 114 are incorporated into ROSFF 104. The design is similar to that in FIG. 11, so only the differences will be described: transistor 118 replaces transistor 46, and transistor 148 replaces transistor 62; the logic gates 92-96 are removed, and the drain of transistor 78 is connected to the gates of transistors 118 and 148, instead of to the input of NAND gate 94; an additional transistor 150 is connected in parallel with transistor 148 such that the sources of the two transistors are connected together, and the drains of the two transistors are connected together; a second additional transistor 116 is connected in series with transistor 118 such that its source is connected to Vdd and its drain is connected to the source of transistor 118; the gates of transistors 116 and 150 are connected to the output OUT.

Transistors 116-154 therefore perform the function of ROSFF 104 and logic gates 108-114 in FIG. 13.

The stage shown in FIG. 15 has the advantage of a reduced number of transistors when compared to the stage of FIG. 11, but requires an additional clock signal.

It will be clear to one skilled in the art that there are many possible alternative implementations of the logical functions described.

Figure 16:
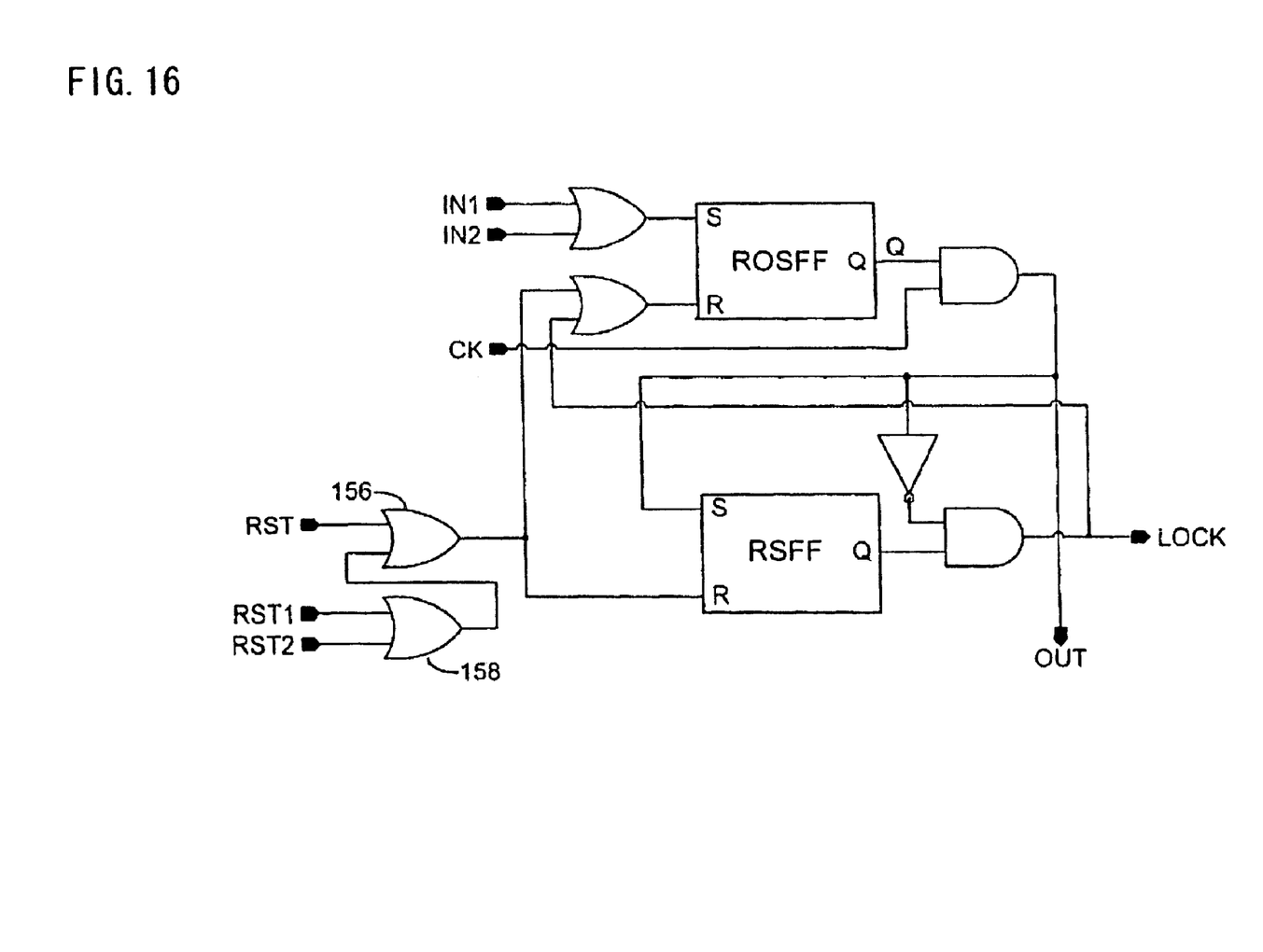
FIG. 16 is a block schematic diagram of a stage of a multiple phase pulse generator constituting another embodiment of the invention.

FIG. 16 shows the fifth embodiment, in which each stage can receive reset signals RST1 and RST2 from neighbouring stages in addition to the global reset signal RST. The stage is similar to that shown in FIG. 9, and only the differences will be described: inputs RST1 and RST2 are connected to the inputs of OR gate 158, the output of which is connected to the second input of OR gate 156; the global reset signal input RST is connected to the first input of OR gate 156. The output of OR gate 156 is connected in the same way as the RST input in FIG. 9.

Inputs RST1 and RST2 of stage n may be connected to the OUT output of stages (n+a) and (n−b) where a, b≧2, or to the LOCK output of stages (n+c) and (n−d) where c, d≧1. Once the active period of the neighbouring stages (n+1) and (n−1) has finished, there is no longer any possibility of stage n being activated, and its LOCK signal can be returned to an inactive state. This embodiment allows each stage of the shift register to generate two output pulses; OUT, which is a copy of a single pulse of the clock CK, and LOCK, which is a longer pulse.

It will be obvious to one skilled in the art that the logical function of the two OR gates 156 and 158 could be combined with a single 3-input OR gate, or that their function may be integrated into the flip-flops, as previously described.

In addition, any of the preceding embodiments may be simplified for unidirectional use. In this case, each stage would omit the second input IN2, and the LOCK or OUT output would only be connected to the input of the following, and not the preceding stage. In FIGS. 9 and 13, IN1 would be connected directly to the S input of the ROSFF 34/104, and the OR gate 38/108 would be omitted. In FIGS. 11 and 15, n transistors 58 and 144 would be removed, and replaced by an open circuit; p transistors 50 and 122 would be omitted and replaced by a short circuit. In FIG. 16, second reset input RST2 would be omitted, and the OR gate 158 would be removed and replaced by a short circuit between the RST1 input and the second input of OR gate 156.

The multiphase pulse generators constituting embodiments of the invention may be used in active matrix devise of the type shown in FIG. 1, such as liquid crystal devices. For example, the generators may be used as multiphase clock generators within the scan drivers and/or data drivers of such devices.

The invention claimed is:

1. A multiple phase pulse generator comprising n stages, where 'n' is greater than one, and each ith stage, for all 'i' such that 1≦i≦n, comprises:
    a first substage having a first memory element; and
    a second substage having a second memory element;
    wherein the first memory element of each jth stage, for all 'j' such that 1<j≦n is arranged to be set by the (j−1)th stage, the first substage of each ith stage being arranged to supply a stage output pulse while the first memory element is set and a clock pulse from a clock input is in a high state,
    wherein the second memory element of each ith stage is arranged to be set by the stage output pulse, and the second substage of each ith stage being arranged to hold the first memory element reset after the stage output pulse while the second memory element is set and from a timing at which the clock pulse is switched from the high state to a low state, and
    wherein the first substage of the ith stage has a set input that is connected to an output of an OR gate, which has an input that is connected to an output of the second substage of the (i−1)th stage and an output of the second substage of the (i+1)th stage.

2. The multiple phase pulse generator as claimed in claim 1, in which 'n' is greater than two.

3. The multiple phase pulse generator as claimed in claim 1, in which the first memory element comprises a reset-over-set flip-flop.

4. The multiple phase pulse generator as claimed in claim 1, in which the second memory element comprises a reset-set flip-flop.

5. The multiple phase pulse generator as claimed in claim 1, in which the first substage comprises a first gate arrangement connected to the first memory element and to the clock input and arranged to pass the clock pulse from the clock input as the stage output pulse while the first memory element is set.

6. The multiple phase pulse generator as claimed in claim 1, in which the second substage comprises a second gate arrangement connected between the second memory element and a reset input of the first memory element and arranged to inhibit resetting of the first memory element during the stage output pulse.

7. The multiple phase pulse generator as claimed in claim 1, in which a set input of the first memory element of each jth stage is connected to receive the stage output pulse from the (j−1)th stage.

8. The multiple phase pulse generator as claimed in claim 7, in which alternate ones of the stages are arranged to receive alternate clock pulses from a clock pulse source.

9. The multiple phase pulse generator as claimed in claim 1, in which the first and second memory elements of each kth stage, for all 'k' such that 1≦k≦(n−a) where a≧1, is arranged to be reset by the (k+a)th stage.

10. The multiple phase pulse generator as claimed in claim 7, in which the first and second memory elements of each kth stage, for all 'k' such that 1≦k≦(n−a) where a≧2, are arranged to be reset by the stage output pulse of the (k+a)th stage.

11. The multiple phase pulse generator as claimed in claim 1, in which the first and second memory elements of each kth stage, for all 'k' such that 1≦k≦(n−a) where a ≧1, are arranged to be reset by the output of the second substage of the (k+a)th stage.

12. The multiple phase pulse generator as claimed in claim 1, in which the first memory element of the first stage is arranged to be set by a first start pulse outputted from outside the n stages.

13. The multiple phase pulse generator as claimed in claim 1, in which the first memory element of each lth stage, for all 'l' such that 1≦l<n, is arranged to be set by the (l+1)th stage.

14. The multiple phase pulse generator as claimed in claim 13, in which the first element of the nth stage is arranged to be set by a second start pulse outputted from outside the n stages.

15. The multiple phase pulse generator as claimed in claim 13, in which a set input of the first memory element of each lth stage is connected to an output of the second substage of each (l+1)th stage.

16. The multiple phase pulse generator as claimed in claim 13, in which a set input of the first memory element of each lth stage is connected to receive the stage output pulse from the (l+1)th stage.

17. The multiple phase pulse generator as claimed in claim 13, in which the first and second memory elements of each mth stage, for all 'm' such that $(b+1)<m\leq n$ where $b\geq 1$, is arranged to be reset by the (m−b)th stage.

18. The multiple phase pulse generator as claimed in claim 16, in which the first and second memory elements of each mth stage, for all 'm' such that $(b+1)<m\leq n$ where $b\geq 2$, are arranged to be reset by the stage output pulse of the (m−b)th stage.

19. The multiple phase pulse generator as claimed in claim 15, in which the first and second memory elements of each mth stage, for all 'm' such that $(b+1)<m\leq n$ where $b\geq 1$, are arranged to be reset by the output of the second substage of the (m−b)th stage.

20. The multiple phase pulse generator as claimed in claim 1, in which the first memory elements of all of the stages are arranged to be reset based on the output of the second substage ORed with a common reset signal.

21. A device including the multiple phase pulse generator as claimed in claim 1.

22. The device as claimed in claim 21, comprising:
a display.

23. The device as claimed in claim 21, comprising:
an active matrix device.

24. The device as claimed in claim 21, comprising:
a liquid crystal device.

* * * * *